United States Patent [19]

Platzer

[11] Patent Number: 5,008,17?

[45] Date of Patent: Apr. 16, 199?

[54] COLOR PROOFING SYSTEM HAVING A GRADUATED LAYER OF RESINS WITH DIFFERENT SOLUBILITIES

[75] Inventor: Stephan J. W. Platzer, Califon, N.J.

[73] Assignee: Hoechst Celanese Corporation, Somerville, N.J.

[21] Appl. No.: 261,372

[22] Filed: Oct. 21, 1989

[51] Int. Cl.$^5$ .................. G03C 5/18; G03C 7/00; G03F 7/30

[52] U.S. Cl. .................. 430/143; 430/141; 430/162; 430/166; 430/175; 430/192; 430/293

[58] Field of Search .................. 430/143, 141

[56] References Cited

U.S. PATENT DOCUMENTS

| | | | |
|---|---|---|---|
| 3,671,240 | 6/1972 | Gramza et al. | 96/29 R |
| 4,072,527 | 9/1978 | Fan | 96/87 R |
| 4,286,043 | 8/1981 | Taylor, Jr. | 430/253 |
| 4,289,841 | 9/1981 | Cohen et al. | 430/253 |
| 4,650,738 | 3/1987 | Platzer et al. | 430/143 |
| 4,659,642 | 4/1987 | Platzer et al. | 430/143 |
| 4,762,766 | 8/1988 | Melbye | 430/143 |
| 4,808,508 | 2/1989 | Platzer | 430/143 |

*Primary Examiner*—Charles L. Bowers, Jr.
*Assistant Examiner*—Patrick A. Doody
*Attorney, Agent, or Firm*—Richard S. Roberts

[57] ABSTRACT

A photosensitive element which comprises a substrate having a release surface; a photosensitive layer having a photosensitizer, pigment, and mixture of binders with different solubility characteristics; and an adhesive layer coated directly on the photosensitive layer. The adhesive solution dissolves one of the resins in the photosensitive layer but does not dissolve the photosensitizer and the resin used to bind the pigment. During overcoating of the adhesive on the photosensitive layer, an increasing gradient of the soluble resin towards the adhesive layer and a decreasing gradient of the photosensitizer and nonsoluble resin is formed.

11 Claims, No Drawings

COLOR PROOFING SYSTEM HAVING A GRADUATED LAYER OF RESINS WITH DIFFERENT SOLUBILITIES

BACKGROUND OF THE INVENTION

In the lithographic printing process, a printer will often prepare a number of metal based lithographic printing plates which are used to reproduce a colored image many thousands of times. One problem in the art is that metal based presensitized printing plates are expensive and errors in the image can cause considerable unnecessary expense. It has therefore become usual to produce a relatively inexpensive color proof to assist a printer in estimating the quality of a set of transparent color separations before starting the expensive printing process. These color proofs are used to judge the color quality that will be obtained during the actual printing process. The proof must be a consistent duplicate of the desired image. Visual examination of a color proof should reveal the color rendition to be expected and any defects on the separations which might need to be altered before making the printing plates.

Color proofing sheets for multicolored printing can be made by using a printing press or proof press. This requires taking all the steps necessary for actual multicolor printing. Therefore, this method of color proofing is itself costly and time consuming. Alternate color proofing methods have been developed to overcome these disadvantages. There are two general types of photoimaging methods for making color proofs; namely the overlay type and the single sheet type.

In the overlay type of color proofing, a separate transparent plastic support is used for producing each color separation film image. A number of such supports, each carrying colored images are then superimposed upon one another and held on a white sheet to produce a color proof. The overlay type of color proofing method has the disadvantage that the superimposed plastic supports tend to distort and darken the color proof, and the impression of the color proof thus prepared becomes different from copies actually obtained with a conventional printing press. Its primary advantage is that it is quickly prepared and can serve as a progressive proof by combining two or more colors in register.

In the single sheet type of color proofing method, a color proofing sheet is prepared by successively producing images of different colors from different color separation films onto a single receptor sheet. This is done by using a single opaque support and by applying toners, photosensitive solutions or coatings of photosensitive materials of corresponding colors on the support in succession. An advantage of the single sheet type of color proof is that the color saturation is not influenced by superimposed plastic supports. This method more closely resembles the actual printing process and eliminates the color distortion inherent in the overlay system.

The present invention relates to improved negative-working and positive-working proofing sheets of the single sheet, solid layer transfer class. Color proofing films of this type are composed of a sheet substrate, a colored photosensitive layer on the sheet, and an adhesive layer disposed on the photosensitive layer.

An example of a negative-working, single sheet approach is described in U.S. Pat. No. 3,671,236. The presensitized element comprises a substrate having a release surface, a pigmented photosensitive layer in contact with the release surface, a pressure sensitive adhesive layer, and a barrier layer between the photosensitive layer and the adhesive layer. The primary function of the barrier layer is to prevent pigment staining on the adhesive during development. The element is used by laminating it to a receiver via the adhesive layer. The substrate is removed, the photosensitive layer is exposed, and the material is processed in a solvent medium. These steps are generally repeated three times to produce a multicolored proof.

An example of a positive-working, single sheet approach is given in U.S. Pat. No. 4,260,673. The presensitized element comprises a substrate having a release surface, a pigmented photosensitive layer in contact with the release surface, a heat sensitive adhesive layer, and a binder layer between the pigmented layer and the adhesive layer. The binder layer comprises a photosensitive compound and prevents pigment staining of the adhesive. The element is processed like the negative-working element in U.S. Pat. No. 3,671,236.

Examples of negative-working and positive-working, single sheet approaches without preventative layers between the photosensitive and adhesive layers are described in U.S. Pat. Nos. 4,650,738 and 4,659,642, respectively. The presensitized elements comprise a sheet having a release surface, a colored photosensitive layer in contact with the release surface, and an adhesive layer directly adhered to said colored layer. The colored photosensitive layer comprises compatible resins to form a substantially uniform layer. The present invention improves upon this method by using an admixture of resins which have a certain type of solubility difference with respect to one another. The result is an intentionally formed gradient of the resin within the colored photosensitive layer. By this means, one resin preferentially migrates to the substrate while the other is conversely preferentially presented to the adhesive layer during adhesive overcoating. An advantage which is attained is that images produced with a gradient resin mixture are more stable at elevated temperatures than nongradient resins or resin mixtures.

SUMMARY OF THE INVENTION

The present invention provides a method for producing an improved photosensitive element which comprises (i) providing a substrate having a release surface; and (ii) coating and drying a photosensitive solution on said release surface to form a photosensitive layer thereon, which photosensitive layer comprises a photosensitizer selected from the group consisting of positive-working, naphthoquinone diazide compounds, and negative-working, polymeric diazonium compounds in a sufficient amount to photosensitize said photosensitive layer; and at least one pigment dispersion in sufficient amount to uniformly color said photosensitive layer, said pigment dispersion comprising in admixture at least one pigment and a first resinous binder compound which is the binder for the said pigment or pigments; and a second resinous binder which is different from the binder for the pigment or pigments, which second resinous binder is present in sufficient amount to uniformly bind the photosensitive layer components in a substantially uniform film; and (iii) coating and drying a nonphotosensitive adhesive composition solution directly on said photosensitive layer to form an adhesive layer thereon, which adhesive composition solution comprises one or more thermoplastic polymers, and a solvent composition in which the first resinous binder and photosensitizer ar insoluble or sparingly soluble and in which the second resinous binder is soluble such that after coating the adhesive composition solution on the photosensitive layer, the second resinous binder is more preferentially migrated toward the adhesive layer than toward the substrate; which adhesive layer is substantially nontacky at room temperature and can be transferred by lamination at temperatures of from about 60° C. and 180° C.

The invention also provides the photosensitive element thereby produced. The invention further provides a method for forming a colored image by first providing the aforesaid photosensitive element and then either (i) laminating said element with heat and pressure via said adhesive layer to a developer resistant receiver sheet; and removing said substrate by the application of peeling forces; and the imagewise exposing said photosensitive layer to actinic radiation; or (ii) imagewise exposing said photosensitive layer to actinic radiation; and laminating said element with heat and pressure via said adhesive layer to a developer resistant receiver sheet; and removing said substrate by the application of peeling forces; or (iii) laminating said element with heat and pressure via said adhesive layer to developer resistant receiver sheet; and imagewise exposing said photosensitive layer to actinic radiation; and removing said substrate by the application of peeling forces.

Then the nonimage areas of said photosensitive layer are removed with a liquid developer, which removing is conducted at a temperature at which said adhesive layer is substantially nontacky. Preferably the above steps are repeated at least once whereby another photosensitive element having a least one different colorant is laminated onto said receptor sheet over the nonremoved portions of the previously laminated and processed photosensitive layer or layers.

DETAILED DESCRIPTION OF THE PREFERRED EMBODIMENT

The present invention broadly provides a photographic element which comprises a substrate having a release surface, a colored photosensitive layer on the release surface which layer contains at least two binders with different solubility characteristics, namely a binder for the photosensitive layer per se and a binder for the pigment within the photosensitive layer; and an adhesive layer on the photosensitive layer.

In the preferred embodiment, the substrate is composed of a dimensionally and chemically stable base material which does not significantly change its size, shape, or chemical properties as the result of the heating, coating, or other treatments which it must undergo. One preferred material is polyethylene terephthalate. In the usual case it has a thickness of from about 1 to about 10 mils, a more preferred thickness is from about 2 to about 5 mils, and most preferably from about 2 to about 3 mils. Suitable films include Hostaphan 3000 available from Hoechst Celanese Corporation, Mylar D available from DuPont, and Melinex 516 available from ICI. The surface of the substrate may be smooth or may be provided with a matte texture by various methods known in the art.

Matte films include Melinex 337 and 470 available from ICI. These materials have the unique property of giving the final image a desired matte finish without any extra steps. One can control the gloss of the final image by properly selecting the matte finish of the temporary support. This effect works because the top layer of the final image is originally in contact with this matte surface. An additional advantage of coating on a matte surface is that subsequently transferred layers generally adhere better to a rough surface than to a smooth surface.

A similar matte finish of the final image can be obtained by embossing the shiny, top surface of the image with a matte material, such as described above. This is done by laminating together the final image and matte material with heat and pressure. The matte material is then generally removed after lamination. The advantage of this method is that the finish of the final proof can be varied. Furthermore, the matting material can be used repeatedly.

A third method for producing a matte finish uses a heat transferable layer, such as Butvar 90 available from Monsanto, coated onto a film with a rough surface, such as Melinex 329 available from ICI. The transferable layer is laminated to the final image under pressure and temperature. Then the film with the rough surface is peeled off. The rough surface of the transferred layer imparts a matte finish to the final image. An additional advantage is that the extra transferred layer protects the image. U.S. Pat. Nos. 4,294,909 and 4,376,159 also suggest various methods for making a matte surface.

In either case, the substrate must have a release surface, that is, it must be capable of releasably holding the photosensitive layer thereto. This may be accomplished by the substrate surface being inherently releasable, rendered releasable by a suitable treatment, or provided with a release layer over the substrate surface. Such a release layer may comprise polyvinyl alcohol.

Releasably bonded to the release surface is the photosensitive layer. The photosensitive layer broadly comprises a photosensitizer, pigment, mixture of first and second resinous binders with different solubilities, and other optional ingredients such as plasticizers, acid stabilizers, surfactants, antistatic compositions, uv absorbers, optical brighteners, organic polymers, inert fillers, and residual coating solvents. The photosensitive composition layer components are blended with a solvent or solvent mixture, coated on the release surface of the substrate, and then dried to remove solvent or solvents. The pigment is introduced into the photosensitive solution as a dispersion with the pigment, first resinous binder, and a solvent or solvent mixture.

The photosensitizer is preferably a light sensitive, polymeric diazonium salt or naphthoquinone diazide compound as are well known in the art. The preferred diazide is the ester of bis-(3-benzoyl-4,5,6-trihydroxyphenyl)methane and 2-diazo-1-naphthol-4 or 5-sulfonic acid as taught in U.S. Pat. No. 4,407,926. Other suitable diazides are taught in U.S. Pat. Nos. 3,106,365; 3,148,983; 3,201,239; and 4,266,001. The preferred diazonium salt is the polycondensation product of 3-methoxy-4-diazodiphenylamine sulfate and 4,4,'-bis-methoxymethyl-diphenyl ether, precipitated as mesitylene sulfonate as taught in U.S. Pat. No. 3,849,392. Other suitable photosensitizers are taught in U.S. Pat. No. 4,436,804. The photosensitizer is preferably not soluble in the solvent mixture used for the adhesive composition.

The photosensitizer is present in the photosensitive layer in an amount sufficient to photosensitize the layer or from about 5% to about 70%; or more preferably from about 10% to about 50% based on the weight of the nonsolvent parts of the photosensitive composition.

Suitable first resinous binders for the pigment dispersion include organic polymeric resins which are not soluble in the solvent or solvent mixtures used for the adhesive overcoat. Examples of such binders nonexclusively include vinyl butyral resins, such as Butvar B-72, B-73, and B-74 available from Monsanto; vinyl propional resins, such as described in U.S. Pat. No. 4,670,507; and vinyl formal resins, such as the Formvar resins available from Monsanto. These resins are insoluble in solvents such as n-butyl acetate, which is an excellent solvent for the adhesive polyvinyl acetate. The most preferred first resinous binder is that described in U.S. Pat. No. 4,670,507 which is incorporated herein by reference. This may be described as a binder resin having the general formula:

-A-B-C- wherein a plurality of each of components A, B and C occur in ordered or random sequence in the resin and wherein A is present in said resin at about 5% to about 30% by weight and comprises groups of the formula:

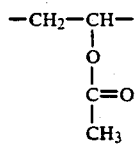

B is present in said resin at about 4% to about 30% by weight and comprises groups of the formula:

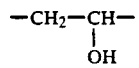

and C is present in said resin at about 50% to about 91% by weight; the weight amount of components A, B, and C being based on the total weight of the resin, and comprises acetal groups consisting of groups of the formulae:

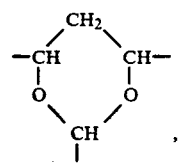

and

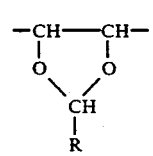

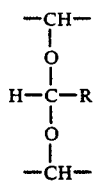

where R is lower alkyl or hydrogen, and wherein said group I is present in component C from about 75% to about 85%, group II is present in component C from about 3% to about 5%, and group III is present in component C from about 10% to about 22%, the percent basis for the acetal groups I, II, and III being on a mole basis of acetal groups I, II, and III of component C.

The first resinous binder is admixed with one or more pigments to produce a pigment dispersion. This dispersion is then added to the other photosensitive solution components to form the photosensitive composition. The colorants useful for the present invention include various classes of pigments. In the most preferred embodiment, pigments having an average particle size of about 1 micrometer or less are used. Nonexclusive examples of pigments usable in the present invention are as follows: Permanent Yellow G (C.I. 21095), Permanent Yellow GR (C.I. 21100), Permanent Yellow DHG (C.I. 21090), Permanent Rubine L6B (C.I. 15850:1), Permanent Pink F3B (C.I. 12433), Hostaperm Pink E (C.I. 73915), Hostaperm Red Violet ER (C.I. 46500), Permanent Carmine FBB (C.I. 12485), Hostaperm Blue B2G (C.I. 74160), Hostaperm Blue A2R (C.I. 74160), and Printex 25. Most of these are products available from Hoechst AG. They can be used separately or blended for a desired color.

The second resinous binder is not intimitely bound by pre-mixture to the pigment particles. Suitable second binders include organic polymeric resins which are soluble in the solvent or solvent mixture used for the adhesive overcoat. These binders have preferably a glass transition temperature above 40° C., more preferably above 50° C. They are preferably not soluble in the developer. Examples of such binders nonexclusively include methyl methacrylate resins, such as Elvacite 2009; methacrylate resins such as Elvacite 2013; ethyl methacrylate resins such as Elvacite 2043; and butyl methacrylate resins, such as Elvacite 2045. These Elvacite resins are available from DuPont and are soluble in n-butyl acetate. The total amount of the first and second resinous binders present in the photosensitive layer is from about 10% to about 80%, or more preferably from about 20% to about 70% based on the weight of the nonsolvent parts of the photosensitive composition. The first resinous binders for the pigments are present in an amount from about ¼ to about 3 times that by weight of the second resinous binders.

Optional plasticizers which may be incorporated into the photosensitive layer include those of the phthalate and phosphate types. Preferred plasticizers include dibutyl phthalate and dimethyl phthalate. Polymeric plasticizers include acrylic resins such as Carboset 525 available from BF Goodrich.

Acid stabilizers include phosphoric acid and p-toluene sulfonic acid.

The photosensitive layer ingredients may be blended with such compatible solvents as gamma butyrolactone, diacetone alcohol, propylene glycol monomethyl ether, ethanol, and methyl ethyl ketone. The solution is then coated and dried on the release surface of the substrate. In the preferred embodiment, the photosensitive layer has a coating weight between approximately 0.1 and 5.0 g/m². The most preferred weight is from about 0.5 to 2.0 g/m².

In the preferred embodiment, the pigment is present in the photosensitive layer in an amount of from about 5 to about 50 percent by weight; or more preferably from about 10 to about 40 percent by weight.

In the preferred embodiment, the plasticizer, when one is used, is present in the photosensitive layer in an amount of up to about 20 percent by weight; or more preferably up to about 15 percent by weight.

In the preferred embodiment, the acid stabilizer, when one is used, is present in the photosensitive layer in an amount of up to about 10 percent by weight.

Typical formulations by weight for the positive-working photosensitive layer include:

|  | Yellow | Magenta | Cyan | Black |
| --- | --- | --- | --- | --- |
| propylene glycol monomethyl ether | 57.00 | 50.40 | 33.72 | 43.44 |
| methyl ethyl ketone | 9.37 | 10.72 | 34.22 | 25.20 |
| gamma-butyrolactone | 19.35 | 22.53 | 16.96 | 15.33 |
| diacetone alcohol | 9.72 | 11.12 | 9.40 | 11.09 |
| polyvinyl propional from U.S. Pat. No. 4,670,507 in example #1 | 0.82 | 0.88 | 1.04 | 0.73 |
| Elvacite 2028 | 0.68 | 1.20 | 1.19 | 0.36 |
| Butvar B-72 | 0.28 | 0.18 | 0.25 | 0.26 |
| Scripset 550 | 0.60 | 0.22 | 0.21 | — |
| Scripset 540 | — | — | — | 1.21 |
| naphthoquinone diazide from U. S. Pat. No. 4,407,926 | 1.50 | 1.87 | 1.78 | 1.49 |
| phthalo blue pigment | — | — | 1.65 | — |
| yellow pigment | 1.56 | — | — | — |
| magenta pigment | — | 1.60 | — | — |
| black pigment | — | — | — | 2.72 |
| optical density | 1.0 | 1.4 | 1.2 | 1.6 |

Butvar and Scripset resins are available from Monsanto. Elvacite resin is available from DuPont. The pigments are introduced as dispersions using the vinyl propional resin.

Typical formulations by weight for the negative-working photosensitive layer include:

|  | Yellow | Magenta | Cyan | Black |
| --- | --- | --- | --- | --- |
| propylene glycol monomethyl ether | 39.81 | 39.66 | 43.94 | 39.54 |
| methyl ethyl ketone | 33.78 | 33.00 | 23.07 | 31.15 |
| gamma-butyrolactone | 6.01 | 6.35 | 8.52 | 8.41 |
| diacetone alcohol | 16.89 | 16.50 | 17.79 | 15.58 |
| polyvinyl propional from U.S. Pat. No. 4,670,507 in example 1 | 0.74 | 2.08 | 2.11 | 1.03 |
| Scripset 540 | 0.32 | 0.28 | 0.23 | 0.35 |
| Elvacite 2043 | 0.36 | 0.38 | 1.88 | 1.21 |
| polymeric diazonium salt from U.S. Pat. No. 3,849,392 | 1.35 | 0.99 | 1.23 | 1.87 |
| phthalo blue pigment | — | 0.02 | 1.14 | — |
| yellow pigment | 0.74 | 0.05 | — | — |
| magenta pigment | — | 0.69 | 0.09 | — |
| black pigment | — | — | — | 0.86 |
| optical density | 0.9 | 1.2 | 1.1 | 1.5 |

The pigments are introduced as dispersions using the vinyl propional resin.

The adhesive layer comprises a thermoplastic polymer or mixture of thermoplastic polymers. The polymers can be selected from thermoplastic polymers which have a glass transition temperature (Tg) preferably between about 20° C. and 100° C., more preferably between about 25° C. and 60° C. The thermoplastic polymer should form a flexible film. They are preferably transparent and colorless, and do not dissolve in the developing medium.

Examples of suitable adhesive materials nonexclusively include vinyl acetate resins, such as Mowilith 20, 25, 30, 40, 50, and 60 available from Hoechst AG; vinyl acetal resins such as Butvar B79 available from Monsanto; and vinyl chloride resins, such as UCAR VYNC available from Union Carbide. These are usually dissolved in n-butyl acetate o other solvent mixture for coating onto the photosensitive layer. It is then dried to a coating weight of from about 3 to about 30 g/m², or more preferably from about 5 to about 20 g/m². The layer may optionally contain a uv absorber such as Uvinul D-50 available from G.A.F. It may also contain a polymeric plasticizer, such as Resoflex R-296 available from Cambridge Industries. It may also contain antistats, such as Gafac and Gafstat available from GAF. It may also contain other resins, such as Nitrocellulose RS ½ available from Hercules. The adhesive layer should not be tacky to the touch, during storage or during development of the photosensitive element. The layer should be transferable in the range of from about 60° C. to about 180° C., or preferably 60° C. to 120° C., or more preferably 60° C. to 100° C. when laminated with heat and pressure. In the preferred embodiment, the thermoplastic polymer or polymers are present in the adhesive layer in a amount of greater than about 50 percent by weight. The plasticizer may be present in an amount of up to about 30 percent by weight, the uv absorber up to about 20 percent by weight, and other resins up to about 50 percent by weight.

The typical adhesive formulations include.

| The typical adhesive formulations include. | |
| --- | --- |
| I. n-butyl acetate | 50.00 |
| UCAR VYNC in isopropylacetate | 50.00 |
| II. n-butyl acetate | 78.00 |
| Resoflex R-296 | 1.00 |
| Mowilith 30 | 21.00 |
| III. n-butyl acetate | 68.70 |
| Uvinul D-50 | 1.30 |
| Mowilith 20 | 30.00 |

The first resinous binder and light sensitive compound in the photosensitive layer are substantially insoluble in the solvent composition for the adhesive layer. However, the second resinous binder is at least partially soluble in the solvent composition for the adhesive layer. Therefore, the first binder is distributed more towards the substrate while the second resinous binder is drawn more towards the adhesive layer during the adhesive overcoating process. This results in an opposite gradient of the binders within the photosensitive layer. The distribution of the pigment particles as observed by scanning electron microscopy verifies the gradient of the binder for the pigment, namely the first binder. The gradient is achieved by selection of adhesive solvents, relative solubility of the binders in the adhesive solvents, and selection of evaporating conditions of the adhesive solvents. It is noticed that the gradient effect in the colored photosensitive layer is caused by the coating of the adhesive layer. This adhesive layer must be coated out of a liquid solution and dried. The layer cannot be applied by lamination of a pre-formed adhesive layer.

In operation, the photosensitive element is laminated to a receiver sheet via the adhesive layer. The receiver sheet should be resistant to any adverse effects which may be caused by the developer of choice and laminating procedure. For example, the receiver sheet should be water resistant if aqueous developers are used and dimensionally stable under the elevated temperature and pressure conditions during lamination. Plastic or plastic coated receiver sheets are useful for this purpose.

Useful receiver sheets include Melinex 329, 339, 994, and 3020 available from ICI. Other white and nonwhite receiver sheets may also be used. Rough textured and/or adhesion promoted surfaces are preferred for the receiver.

Lamination may be conducted by putting the receiver sheet in contact with the adhesive side of the colored composite and then introducing the two materials into the nip of a pair of heated laminating rollers under suitable pressure. Suitable laminating temperatures usually range from about 60° C. to about 180° C., preferably from about 60° C. to about 120° C. After lamination, the substrate is peeled away, usually merely employing manual peeling forces. The adhesive and photosensitive layers thus remain on the receiver sheet.

The photosensitive layer is imagewise exposed by means well known in the art either before or after lamination. Such exposure may be conducted by exposure to a uv light source through a color separation under vacuum frame conditions. Exposures after lamination and peel apart are preferred for emulsion-to-photosensitive layer contact. Mercury vapor discharge lamps are preferred over metal halide lamps. Other radiation sources, such as carbon arc, pulsed xenon, and lasers, may be used. Light absorbing filters may be used to reduce light scattering in the material.

After lamination, substrate removal, and exposure, the photosensitive layer is developed by dissolving the nonimage areas in a suitable developer and dried. A suitable, organic solvent free developer useful for developing the exposed photosensitive layer containing the binders of the present invention includes an aqueous solution containing one or more of the following groups:

(a) a sodium, potassium or lithium salt of octyl, decyl, dodecyl, or tetradecyl monosulfate;
(b) a sodium, lithium, potassium, or ammonium metasilicate salt;
(c) a lithium, potassium, sodium, or ammonium borate salt;
(d) an aliphatic dicarboxylic acid, or sodium, potassium or ammonium salt thereof having from 2 to 6 carbon atoms; and
(e) mono, di-, or tri-sodium or potassium phosphate.

Other suitable aqueous developers include benzoic acid or sodium, lithium and potassium benzoates and hydroxy substituted analogs thereof, and mixtures thereof, as well as those developers described in U.S. Pat. No. 4,436,807. The adhesive layer is substantially not removed by this development. Specific examples of suitable developers nonexclusively include:

| I. water | 95.0 |
|---|---|
| sodium decyl sulphate | 3.0 |
| disodium phosphate | 1.5 |
| sodium metasilicate | 0.5 |
| II. water | 89.264 |
| monosodium phosphate | 0.269 |
| trisodium phosphate | 2.230 |
| sodium tetradecyl sulfate | 8.237 |

Any developer solution which satisfactorily removes the nonimage areas of the photosensitive layer after exposure while retaining the image areas may be used. The selection of developer is well within the ability of the skilled artisan.

After development, the imaged material on the receiver sheet along with the adhesive layer is rinsed generally with an aqueous solution and then dried.

The process of lamination, substrate removal, exposure, and development can then be repeated whereby another photosensitive element having a different color is laminated to the same receiver sheet over the previously formed image. In the usual case, four colored layers are employed to produce a full color reproduction of a desired image. These are cyan, magenta, yellow and black. All of the foregoing patents are incorporated herein by reference.

The following nonlimiting examples serve to illustrate the invention.

EXAMPLE 1

Four photosensitive solutions of cyan, yellow, magenta, and black are produced according to the positive-working photosensitive formulations as described above. The solutions are coated and dried separately to the required optical density onto four 3 mil Melinex 516 polyester substrates. The surface densities are roughly 1.2 $g/m^2$ for cyan, 1.4 $g/m^2$ for yellow, 1.3 $g/m^2$ for magenta, and 1.8 $g/m^2$ for black. The adhesive solution, in particular adhesive formulation II as described above, is coated on top of the photosensitive layers and dried to a surface density of 12 $g/m^2$. The yellow composite is then laminated at 75° C. with the adhesive side onto either side of a 7 mil Melinex 3020 polyester receiver sheet. The 516 temporary substrate is peeled away after lamination, leaving the adhesive and photosensitive layers on the receiver sheet. The yellow photosensitive layer is then exposed to actinic light through a positive photographic color separation for the yellow color. The receiver sheet with the exposed yellow layer is then developed with the developer formulation II with gentle pad rubbing on the photosensitive side. The exposed, yellow areas are thereby washed off and the nonexposed areas remain during development. The adhesive layer is not affected by the developer. After this treatment, the imaged material is rinsed and then dried. The magenta composite is then laminated as before onto the imaged, yellow side of the receiver sheet. The substrate is removed as before. The magenta layer is then exposed through the magenta separation. It is then processed as performed with the yellow photosensitive layer. The magenta is followed in a like manner by cyan and then by black to give a four color image which is an accurate representation of the original from which the separations are prepared.

As a comparison, the above example is repeated but an identical adhesive layer is laminated from a temporary support onto the photosensitive layer, instead of being coated. The exposed areas cannot be developed within the development time used for the above example. This indicates that the Elvacite which is not soluble in the developer is hindering the development of the laminated sample. Whereas, the Elvacite is towards the adhesive layer in the overcoated sample, allowing the developer to remove the exposed portions containing mainly the vinyl propional resin, which is soluble in this developer.

EXAMPLE 2

Four photosensitive solutions of cyan, yellow, magenta, and black are produced according to the negative-working photosensitive formulations as described above. The solutions are coated and dried separately to the required optical density onto four 3 mil Melinex 516 polyester substrates. The surface densities are roughly 1.3 g/m² for cyan, 0.9 g/m² for magenta, and 1.2 g/m² for black. The adhesive solution, in particular adhesive formulation II as described above, is coated on top of the photosensitive layers and dried to a surface density of 12 g/m². The yellow composite is then laminated at 75° C. with the adhesive side onto either side of a 7 mil Melinex 3020 polyester receiver sheet. The 516 substrate is peeled away after lamination leaving the adhesive and photosensitive layers on the receiver sheet. The yellow photosensitive layer is then exposed to actinic light through a negative photographic color separation for the yellow color. The receiver sheet with the exposed yellow layer is then developed with developer formulation II with gentle pad rubbing on the photosensitive side. The nonexposed, yellow areas are thereby washed off and the exposed areas remain during development. The adhesive layer is not affected by the developer. After this treatment, the imaged material is rinsed and then dried. The magenta composite is then laminated as before onto the imaged, yellow side of the receiver sheet. The substrate is removed as before. The magenta layer is then exposed through the magenta separation. It is then processed as with the yellow. The magenta is followed in a like manner by cyan and then by black to give a four color image which is an accurate representation of the original from which the separations are prepared.

As a comparison, this above example is repeated but an identical adhesive layer is laminated from a temporary support onto the photosensitive layer, instead of being coated. The nonexposed areas cannot be developed within the development time used for the above example. This confirms that the Elvacite is uniformly distributed throughout the photosensitive layer of the laminated sample. Whereas the overcoated sample has a gradient of Elvacite with the largest amount near the photosensitive layer/adhesive layer interface.

What is claimed is:

1. A method for forming a colored image which comprises
    (A) providing a photosensitive element which comprises
        (i) a substrate having a release surface; and
        (ii) a coated and dried photosensitive solution, defining a photosensitive layer, on said release surface, which photosensitive layer comprises a photosensitizer selected from the group consisting of positive-working, naphthoquinone diazide compounds, and negative-working, polymeric diazonium compounds in a sufficient amount to photosensitize said photosensitive layer; and at least one pigment dispersion in sufficient amount to uniformly color said photosensitive layer, said pigment dispersion being formed by intimately pre-admixing at least one pigment and a first resinous binder compound which is the binder for the said pigment or pigments; and a second resinous binder which is different from the binder for the pigment or pigments, which second resinous binder is present in sufficient amount to uniformly bind the photosensitive layer components in a substantially uniform film and wherein said second resinous binder is not intimately bound by pre-admixture to said pigment; and
        (iii) a coated and dried a nonphotosensitive adhesive composition solution, defining an adhesive layer, directly on said photosensitive layer, which adhesive composition solution comprises one or more thermoplastic polymers and a solvent composition in which the first resinous binder and photosensitizer are insoluble or sparingly soluble and in which the second resinous binder is soluble such that after having coated and dried the adhesive composition solution on the photosensitive layer, the second resinous binder is more preferentially migrated toward the adhesive layer than toward the substrate; which adhesive layer is substantially nontacky at room temperature and can be transferred by lamination at temperatures of from about 60° C. and 180° C.; and
    B. either
        (a) laminating said element with heat and pressure via said adhesive layer to a developer resistant receiver sheet; and removing said substrate by the application of peeling forces; and imagewise exposing said photosensitive layer to actinic radiation to thereby form image areas in either the exposed or unexposed areas and oppositely nonimage areas in either the unexposed or exposed areas; or
        (b) imagewise exposing said photosensitive layer to actinic radiation to thereby form image areas in either the exposed or unexposed areas and oppositely nonimage areas in either the unexposed or exposed areas; and laminating said element with heat and pressure via said adhesive layer to a developer resistant receiver sheet; and removing said substrate by the application of peeling forces; or
        (c) laminating said element with heat and pressure via said adhesive layer to a developer resistant receiver sheet; and imagewise exposing said photosensitive layer to actinic radiation to thereby form image areas in either the exposed or unexposed areas and oppositely nonimage areas in either the unexposed or exposed areas; and removing said substrate by the application of peeling forces; and
    C. thereafter removing the nonimage areas of said photosensitive layer with a liquid developer, which removing is conducted at a temperature at which said adhesive layer is substantially nontacky.

2. The method of claim 1 wherein steps A through C are repeated at least once whereby another photosensitive element according to step A and having at least one different colorant is laminated, exposed and the substrate removed and the nonimage areas removed according to steps B and C onto said receiver sheet over the nonremoved portions of the previously laminated and processed photosensitive layer or layers.

3. The method of claim 1 wherein said substrate comprises polyethylene terephthalate.

4. The method of claim 1 wherein said substrate has a matte surface.

5. The method of claim 1 wherein said release surface on said substrate comprises polyvinyl alcohol.

6. The method of claim 1 wherein said photosensitizer in the photosensitive layer comprises the polycondensation product of 3-methoxy-4-diazo-diphenylamine sulfate and 4,4'-bis-methoxymethyl-diphenyl ether precipitated as mesitylene sulfonate; or the ester of bis-(3-benzoyl-4,5,6-trihydroxyphenyl)methane and 2-diazo-1-naphthol-4 or 5-sulfonic acid.

7. The method of claim 1 wherein said photosensitive layer further comprises one or more ingredients selected from the group consisting of plasticizers, acid stabilizers, anti-static compositions, uv absorbers, surfactants, organic polymers, optical brighteners, and inert fillers.

8. The method of claim 1 wherein said adhesive layer comprises one or more thermoplastic polymers selected from the group consisting of vinyl acetate, vinyl acetals, and vinyl chloride polymers and copolymers.

9. The method of claim 1 wherein the adhesive layer further comprises one or more ingredients selected from the group consisting of uv absorbers, antistatic compositions, resins, optical brighteners, and plasticizers.

10. The method of claim 1 wherein the laminating step is conducted at a temperature of from about 60° C. to about 180° C.

11. The method of claim 1 wherein the substrate comprises polyethylene terephthalate; and the photosensitizer is present in the photosensitive layer in an amount of from about 5 to about 70 percent by weight of the nonsolvent parts of the layer; and the pigment is present in the photosensitive layer in an amount of from about 5 to about 50 percent by weight of the layer; and the first and second resinous binders are present in the photosensitive layer in an amount of from about 10 to about 80 percent by weight of the layer wherein the first resinous binder is present in an amount of from about $\frac{1}{4}$ to about 3 times the weight amount of the second resinous binder; and the adhesive layer comprises a vinyl acetate homopolymer or copolymer.

* * * * *